(12) United States Patent
Bena et al.

(10) Patent No.: US 8,314,522 B2
(45) Date of Patent: Nov. 20, 2012

(54) PRINTED CIRCUIT BOARD WITH GROUND CONDUCTOR FOR ELECTRIC MOTOR, AND ELECTRIC MOTOR

(75) Inventors: Maire-Pierre Bena, Cerdon du Loiret (FR); Mickael Lebourgeois, Auvilliers en Gatinais (FR); Laurent Robin, Ouzouer-le-Marche (FR)

(73) Assignee: Inteva Products France SAS (FR)

( * ) Notice: Subject to any disclaimer, the term of this patent is extended or adjusted under 35 U.S.C. 154(b) by 1024 days.

(21) Appl. No.: 11/714,935

(22) Filed: Mar. 7, 2007

(65) Prior Publication Data

US 2007/0218719 A1    Sep. 20, 2007

(30) Foreign Application Priority Data

Mar. 14, 2006    (DE) .................... 10 2006 011 674

(51) Int. Cl.
*H02K 1/32*    (2006.01)
(52) U.S. Cl. .......................................................... 310/61
(58) Field of Classification Search .................. 361/760; 310/61, 62
See application file for complete search history.

(56) References Cited

U.S. PATENT DOCUMENTS

| | | | | |
|---|---|---|---|---|
| 3,895,247 A * | 7/1975 | Iwata et al. ................. | 310/68 D |
| 4,779,031 A * | 10/1988 | Arends et al. ................. | 318/565 |
| 4,937,705 A * | 6/1990 | Piber ............................. | 361/710 |
| 4,958,115 A * | 9/1990 | Miller ........................... | 318/662 |
| 5,038,088 A * | 8/1991 | Arends et al. ................. | 318/565 |
| 5,044,963 A * | 9/1991 | Kukkonen et al. ............. | 439/55 |
| 5,244,395 A * | 9/1993 | DeSantis et al. ............... | 439/65 |
| 5,691,584 A * | 11/1997 | Toida et al. .................. | 310/67 R |
| 5,755,027 A * | 5/1998 | Impey ............................. | 29/849 |
| 5,925,948 A * | 7/1999 | Matsumoto ................. | 310/67 R |
| 5,932,942 A * | 8/1999 | Patyk et al. .................... | 310/58 |
| 5,939,807 A * | 8/1999 | Patyk et al. .................... | 310/89 |
| 5,942,819 A * | 8/1999 | Burgess et al. ................. | 310/51 |
| 5,963,425 A * | 10/1999 | Chrysler et al. ............. | 361/695 |
| 6,005,314 A * | 12/1999 | Fisher et al. ................. | 310/68 C |
| 6,078,117 A * | 6/2000 | Perrin et al. ................. | 310/68 R |
| 6,111,196 A * | 8/2000 | Arai ............................... | 174/50 |
| 6,166,464 A * | 12/2000 | Grant .......................... | 310/68 R |
| 6,201,710 B1 * | 3/2001 | Bagung et al. ................. | 361/799 |
| 6,285,548 B1 * | 9/2001 | Hamlet et al. ................. | 361/695 |
| 6,296,514 B1 * | 10/2001 | Medina et al. ................. | 439/404 |
| 6,771,509 B2 * | 8/2004 | Wakabayashi et al. ........ | 361/719 |
| 6,992,414 B2 * | 1/2006 | Thomson et al. ............... | 310/71 |
| 7,259,487 B2 * | 8/2007 | Mullin et al. ................... | 310/91 |
| 7,262,530 B2 * | 8/2007 | Becker et al. ................. | 310/89 |
| 7,394,176 B2 * | 7/2008 | Guttenberger ............. | 310/68 R |
| 2007/0018517 A1 * | 1/2007 | Huck et al. ...................... | 310/71 |

* cited by examiner

*Primary Examiner* — Amy Cohen Johnson
*Assistant Examiner* — Vladimir Imas
(74) *Attorney, Agent, or Firm* — Cantor Colburn LLP

(57) ABSTRACT

A printed circuit board (PCB), in particular for an electric motor, has two opposite main surfaces with at least one main surface carrying electrical components. A plurality of outer end faces extend between the two opposite main surfaces. One of the outer end faces is provided with a metallization that is connected to a ground conductor on the PCB.

12 Claims, 1 Drawing Sheet

PRINTED CIRCUIT BOARD WITH GROUND CONDUCTOR FOR ELECTRIC MOTOR, AND ELECTRIC MOTOR

RELATED APPLICATIONS

The application claims priority to German Application No. 10 2006 011 674.7 which was filed on Mar. 14, 2006.

BACKGROUND OF THE INVENTION

The invention relates to a printed circuit board, in particular, for an electric motor such as a DC motor. Further, the invention relates to an electric motor having such a printed circuit board.

DC motors equipped with control electronics have at least a so-called "ground" conductor on the printed circuit board (PCB). In order to contact the ground conductor, a through-hole connection can be used. The problem is that this type of connection is not very reliable when subjected to mechanical stress. Moreover, this solution is taking place on a surface of the PCB.

The object of the invention is to provide a PCB which provides a reliable contact for a ground conductor on the PCB, and which does not take up a significant amount of space on the PCB.

SUMMARY OF THE INVENTION

To this end, the invention provides a printed circuit board (PCB), in particular for an electric motor, having two opposite main surfaces of which at least one main surface carries electrical components, and a plurality of outer end faces that extend between the main surfaces. One of the outer end faces is provided with a metallization that is connected to a ground conductor of the PCB. The invention is based on the idea of using one of the outer end faces of the PCB as a contact surface at which a ground contact can easily engage, so that the ground contact of the electric motor can be easily connected. An electrical connection between the ground contact and the metallization on the end face of the PCB is not affected by mechanical stress as the ground contact can, for example, be formed as an elastic tab.

The invention also provides an electric motor having a PCB of the type mentioned-above, wherein a motor ground contact is provided that contacts the metallization on an outer end face of the PCB.

These and other features of the present invention can be best understood from the following specification and drawings, the following of which is a brief description.

DETAILED DESCRIPTION OF THE PREFERRED EMBODIMENT

Figure 1:
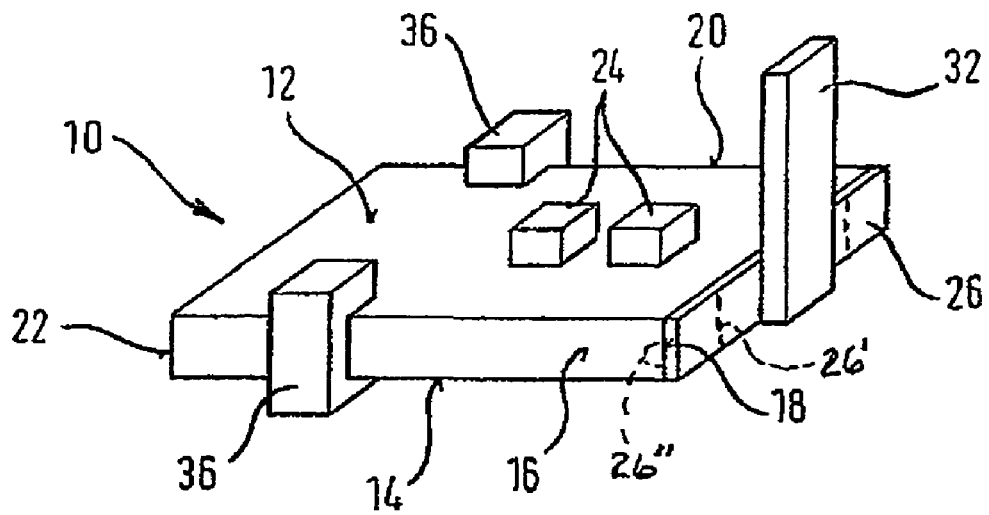
FIG. 1 shows a perspective view of a printed circuit board contacted by a ground contact, and FIG. 2 schematically shows an electric motor with a PCB in a side view.
Figure 2:
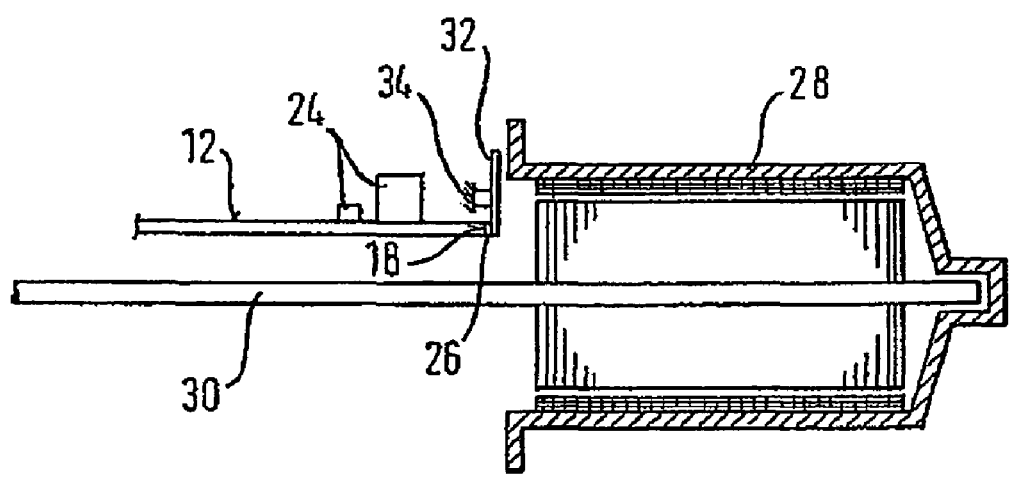

In FIGS. 1 and 2, a printed circuit board (PCB) 10 is shown. The PCB 10 It has two main surfaces 12, 14 that are also referred to as upper and lower surfaces. Lateral surfaces of the PCB are referred to as outer end faces 16, 18, 20, 22. Electrical components 24 are arranged on main surface 12. The electrical components 24 could also be arranged on main surface 14.

On one outer end face, namely on end face 18, the PCB 10 is provided with a metallization 26. The metallization 26 is formed from a material that has a good electrical conductivity, for example copper, and is plated to avoid corrosion. Suitable materials are Ni, Au or Sn. The metallization 26 is in electrical connection on the PCB 10 with a ground conductor (not shown). Electrical components 24 can also be in electrical connection with the ground conductor on the PCB 10.

The PCB 10 is used here as a component of an electric motor, which is schematically represented by a stator 28 and a rotor 30. The electrical ground connection between stator 28 and the PCB 10 is effected by a ground contact 32 which is held fixed at a schematically depicted housing portion 34. Ground contact 32 is formed as an elastic tab so that the ground contact 32 enters into surface contact with metallization 26 on PCB 10 in a spring like manner.

In the embodiment described as an example, a sliding guide 36 is provided as part of the housing portion 34, which acts as a holder for PCB 10. During assembly, the PCB 10 can be inserted into the sliding guide 36 so that the metallization 26 on outer end face 18 contacts ground contact 32. The assembly of the PCB 10 inside the electric motor is done such that the metallization 26 on the outer end face 18 contacts ground contacts 32.

Metallization 26 is here shown as extending over the entire, straight outer end face 18 of PCB 10. Obviously, a metallization 26' could be formed so as to extend over only a fraction of the length of the outer end face. Further, the metallization need not necessarily be formed in a straight line but could cover a groove or a notch 26" in the outer end face of the PCB 10.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An electric motor having a PCB comprising:
   two opposite main surfaces wherein at least one of the two opposite main surfaces carries electrical components;
   a plurality of outer end faces that extend between the two opposite main surfaces, one of the plurality of outer end faces being provided with a metallization that is connected to a ground conductor on the PCB;
   a motor ground contact that contacts the metallization on the one of the plurality of outer end faces of the PCB;
   a stator;
   a rotor; and
   wherein the motor ground contact comprises an electrical ground connection between the stator and the PCB, the motor ground contact being held fixed by a housing.

2. The electric motor of claim 1 wherein the metallization extends over an entire surface of the one of the plurality of outer end faces.

3. The electric motor of claim 1 wherein the metallization extends over only a portion of the one of the plurality of outer end faces.

4. The electric motor of claim 1 wherein the one of the plurality of outer end faces that carries the metallization comprises a flat surface.

5. The electric motor of claim 1 wherein the one of the plurality of outer end faces that carries the metallization has a groove.

6. The electric motor of claim 1 wherein the motor ground contact is formed as an elastic tab.

7. The electric motor of claim 1 including a holder, into which the PCB can be slidingly inserted so that the metallization comes into contact with the motor ground contact.

8. The electric motor of claim 1 wherein the metallization is provided directly on the one of the plurality of outer end faces.

9. The electric motor of claim 1 wherein the metallization comprises a conductive layer of material provided on the one of the plurality of outer end faces.

10. The electric motor of claim 1 wherein the motor ground contact is formed as an elastic tab that directly engages a contact surface of the metallization in a resilient manner.

11. The electric motor of claim 1 wherein the housing includes a sliding guide comprising a holder for the PCB.

12. The electric motor of claim 11 wherein the PCB is positioned within the electric motor such that the metallization on the outer end face directly contacts the motor ground contact.

* * * * *